United States Patent
Li

(10) Patent No.: US 10,559,767 B2
(45) Date of Patent: Feb. 11, 2020

(54) FLEXIBLE ORGANIC LIGHT EMITTING DIODE DISPLAY DEVICE

(71) Applicant: Wuhan China Star Optoelectronics Semiconductor Display Technology Co., Ltd., Wuhan (CN)

(72) Inventor: Yun Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/079,108

(22) PCT Filed: Aug. 2, 2018

(86) PCT No.: PCT/CN2018/098347
§ 371 (c)(1),
(2) Date: Aug. 23, 2018

(65) Prior Publication Data
US 2020/0006679 A1    Jan. 2, 2020

(30) Foreign Application Priority Data
Jun. 29, 2018 (CN) .......................... 2018 1 0700353

(51) Int. Cl.
*H01L 51/56* (2006.01)
*H01L 51/00* (2006.01)
*H01L 51/52* (2006.01)
*G06F 1/16* (2006.01)

(52) U.S. Cl.
CPC ........ *H01L 51/0097* (2013.01); *G06F 1/1652* (2013.01); *H01L 51/5246* (2013.01); *H01L 2251/5338* (2013.01)

(58) Field of Classification Search
CPC ...... G06F 1/1652; H05B 33/22; H05K 1/028; H05K 2201/055; H05K 2201/10128; H01L 51/0097; H01L 51/5246; H01L 2251/5338
See application file for complete search history.

(56) References Cited

U.S. PATENT DOCUMENTS

| 2011/0134144 A1* | 6/2011 | Moriwaki | ............ G09G 3/3208 345/660 |
| 2011/0235160 A1* | 9/2011 | Hsieh | ................ G02F 1/133305 359/296 |
| 2014/0065326 A1 | 3/2014 | Lee et al. | |

(Continued)

FOREIGN PATENT DOCUMENTS

| CN | 106328599 | 1/2017 |
| CN | 106910823 | 6/2017 |

(Continued)

*Primary Examiner* — Ahmed N Sefer

(57) ABSTRACT

A flexible organic light emitting diode (OLED) display device is provided and includes a housing and an OLED display panel disposed in the housing. The housing comprises a substrate having at least one first bending section disposed in the middle of the substrate and the OLED display panel is disposed on the surface of the substrate. The beneficial effects are that the OLED display panel is supported and protected by disposing a housing which adapts to the OLED display panel before and after the OLED display panel is bent to prevent the OLED display panel from being extruded, thereby preventing damage to the OLED display panel.

13 Claims, 2 Drawing Sheets

(56) References Cited

U.S. PATENT DOCUMENTS

| | | | | |
|---|---|---|---|---|
| 2015/0192951 A1* | 7/2015 | Chong | ............... | G06F 1/1601 |
| | | | | 359/894 |
| 2015/0365124 A1* | 12/2015 | Choi | ............... | H04B 1/3888 |
| | | | | 455/575.8 |
| 2016/0054759 A1* | 2/2016 | Lee | ............... | G06F 1/1656 |
| | | | | 361/679.28 |
| 2016/0209877 A1* | 7/2016 | Chong | ............... | G06F 1/1652 |
| 2017/0062742 A1* | 3/2017 | Kim | ............... | H01L 51/0097 |
| 2017/0330925 A1* | 11/2017 | Tang | ............... | H01L 27/3267 |
| 2017/0373121 A1 | 12/2017 | Leng et al. | | |

FOREIGN PATENT DOCUMENTS

| | | |
|---|---|---|
| CN | 107564417 | 1/2018 |
| CN | 108230907 | 6/2018 |

\* cited by examiner

FLEXIBLE ORGANIC LIGHT EMITTING DIODE DISPLAY DEVICE

RELATED APPLICATIONS

This application is a National Phase of PCT Patent Application No. PCT/CN2018/098347 having International filing date of Aug. 2, 2018, which claims the benefit of priority of Chinese Patent Application No. 201810700353.0 filed on Jun. 29, 2018. The contents of the above applications are all incorporated by reference as if fully set forth herein in their entirety.

FIELD AND BACKGROUND OF THE INVENTION

The invention relates to the field of display technologies, and more particularly to a flexible organic lighting emitting diode display device.

In recent years, the applications of organic lighting emitting diode (OLED) display screens in aspects of smart phones, smart wristbands, televisions, computers, etc., have been fast-growing trends. There are more and more high-end machines employ OLED screens, in particular flexible OLED screens. Compared with liquid crystal displays (LCDs), the flexible OLEDs not only possess properties of high contrast ratio, low power consumption, ultra-thin, etc., but also properties of being bendable and great flexibility. The flexible OLEDs possess wide range of prospects in the field of foldable screens.

At present, there is still no reference to schemes of infolding flexible OLED products in the market. Difficulties in designing infolding flexible OLED products further include the design of housings. The existing housing structures do not fit OLED bending sections and there is a risk that the OLEDs are extruded and deformed before and after the OLEDs are bent.

In conclusion, there is a problem that the existing encapsulation structures do not fit the bending sections of the flexible OLEDs.

SUMMARY OF THE INVENTION

A flexible organic light emitting diode (OLED) display device is provided which can protect an OLED display panel from being extruded by a housing before and after the OLED display panel is bent and prevent the OLED display panel from being damaged to solve the problem that the bending sections of the flexible OLEDs do not fit the housing where the bending sections is located.

In order to solve the above-mentioned problems, the technical schemes provided by the present disclosure are as follows:

The present disclosure provides a flexible organic light emitting diode (OLED) display device, comprising: a housing and an OLED display panel disposed in the housing;

wherein the housing comprises:

a substrate having at least one first bending section disposed in the middle of the substrate; and an encapsulation layer covering a surface of the substrate and a surface of the first bending section;

wherein the OLED display panel is disposed on the surface of the substrate, the OLED display panel comprises at least one second bending section, the first bending section is disposed at a position corresponding to the second bending section, and the first bending section is greater than the second bending section.

According to a preferred embodiment, the encapsulation layer is made of a leather material.

According to a preferred embodiment, the first bending section comprises a first buffer portion, a second buffer portion, and an adhesive layer, and the adhesive layer is disposed between the first buffer portion and the second buffer portion.

According to a preferred embodiment, the housing and the OLED display panel is connected via the adhesive layer.

According to a preferred embodiment, the substrate is made of a metal material, the first buffer portion and the second buffer portion are made of a foam material, wherein a material of the adhesive layer is glue.

According to a preferred embodiment, each of two opposite ends of the substrate is bent and defined an opposite receiving groove and ends of the flexible OLED panel are attached at the respective two receiving grooves.

According to a preferred embodiment, each of the two ends of the substrate is double-bent and defined a first bending portion and a second bending portion in sequence and the receiving groove is constructed of the first bending portion, the second bending portion, and a portion of the substrate which is adjacent to the first bending portion.

According to a preferred embodiment, each of the two ends of the substrate comprises a magnet, and each magnet is disposed on each outer surface of the second bending portion.

According to a preferred embodiment, each of the receiving grooves comprises a foam disposed therein and the foam is configured to prevent the ends of the flexible OLED panel from being extruded and deformed.

The present disclosure further provides a flexible organic light emitting diode (OLED) display device, comprising: a housing and an OLED display panel disposed in the housing;

wherein the housing comprises:

a substrate having at least one first bending section disposed in the middle of the substrate; and wherein the OLED display panel is disposed on the surface of the substrate, the OLED display panel comprises at least one second bending section, the first bending section is disposed at a position corresponding to the second bending section, and the first bending section is greater than the second bending section.

According to a preferred embodiment, the first bending section comprises a first buffer portion, a second buffer portion, and an adhesive layer, and the adhesive layer is disposed between the first buffer portion and the second buffer portion.

According to a preferred embodiment, the housing and the OLED display panel is connected via the adhesive layer.

According to a preferred embodiment, the substrate is made of a metal material, the first buffer portion and the second buffer portion are made of a foam material, wherein a material of the adhesive layer is glue.

According to a preferred embodiment, each of two opposite ends of the substrate is bent and defined an opposite receiving groove and ends of the flexible OLED panel are attached at the respective two receiving grooves.

According to a preferred embodiment, each of the two ends of the substrate is double-bent and defined a first bending portion and a second bending portion in sequence and the receiving groove is constructed of the first bending portion, the second bending portion, and a portion of the substrate which is adjacent to the first bending portion.

According to a preferred embodiment, each of the two ends of the substrate comprises a magnet, and each magnet is disposed on each outer surface of the second bending portion.

According to a preferred embodiment, each of the receiving grooves comprises a foam disposed therein and the foam is configured to prevent the ends of the flexible OLED panel from being extruded and deformed.

The beneficial effects of the present disclosure are that the OLED display panel is supported and protected by disposing a housing which adapts to the OLED display panel before and after the OLED display panel is bent to prevent the OLED display panel from being extruded, thereby preventing damage to the OLED display panel.

BRIEF DESCRIPTION OF THE SEVERAL VIEWS OF THE DRAWINGS

In order to illustrate a technical solution in the embodiments or in the prior art more clearly, the accompanying drawings required in the description of the embodiments or the prior art are introduced briefly hereafter. It is obvious that the accompanying drawings in the following description are merely part of the embodiments of the present invention. People with ordinary skills in the art can obtain other drawings without making inventive efforts.

DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

Figure 1:
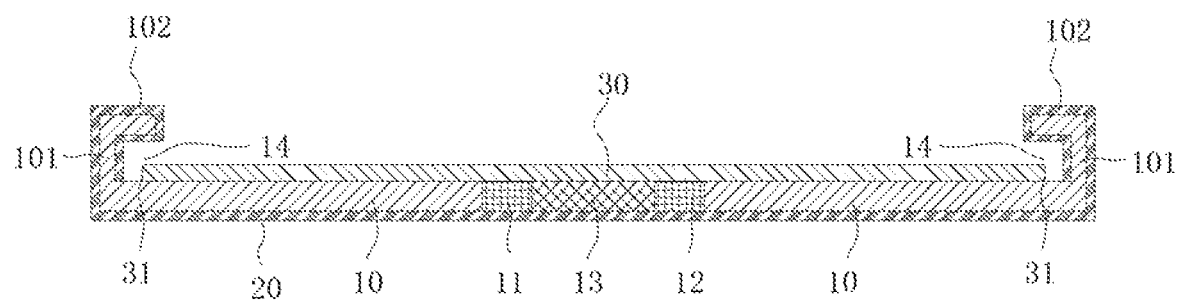
FIG. 1 is a structural schematic diagram of the first preferred embodiment of a flexible OLED display device according to the present disclosure.
Figure 2:
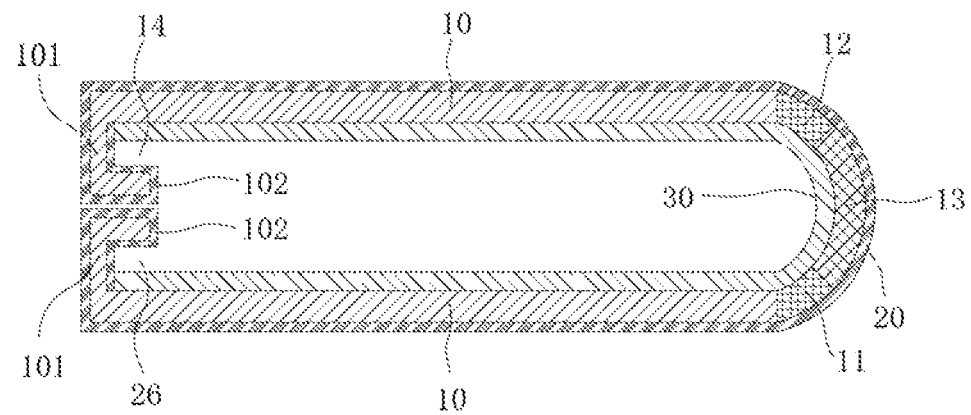
FIG. 2 is another structural schematic diagram of the first preferred embodiment of a flexible OLED display device according to the present disclosure.

Please refer to FIGS. 1-2 which are structural schematic diagrams of the first preferred embodiment of a flexible organic light emitting display (OLED) display device according to the present disclosure.

As shown in FIG. 1, FIG. 1 is a structural schematic diagram of a flexible OLED display device according to the first preferred embodiment, shown with the flexible OLED display device in an open state. The flexible OLED display device according to the present preferred embodiment comprises a housing and an OLED display panel 30 disposed in the housing, wherein the housing comprises a substrate 10 and an encapsulation layer 20. The OLED display panel 30 is disposed on a surface of the substrate 10.

A first bending section is disposed in the middle of the substrate 10. The first bending section comprises a first buffer portion 11, a second buffer portion 12, and an adhesive layer 13. The encapsulation layer 20 covering the surface of the substrate 10 and a surface of the bending section.

The OLED display panel 30 comprises a second bending section, the first bending section is disposed at a position corresponding to the second bending section, and the first bending section is greater than the second bending section. The second bending section and the first bending section are bent together.

The substrate 10 is made of a metal material and performs a function of supporting the OLED display panel 30.

The encapsulation layer 20 is made of a leather material. Leather materials possess features of high flexibility and great abrasion resistance. The encapsulation layer 20 can not only be bent with the first bending section which is disposed on the substrate 10, but also protect the substrate 10 and the first bending section from being worn out, thereby reducing abrasion to the substrate 10 and the first bending section.

Both the first buffer portion 11 and the second buffer portion 12 are made of foam materials. The foam materials have tiny micropores and possess properties of great elasticity and light weight. The first buffer portion 11 and the second buffer portion 12 perform functions of resisting compression, buffering and supporting during bending.

The adhesive layer 13 is a cured glue layer. A space is reserved between the first buffer portion 11 and the second buffer portion 12 and the space is filled with glue. Then the OLED display panel 30 is attached to the surface of the substrate 10. After the glue is cured, an adhesive layer 13 is formed. The adhesive layer 13 performs a function of connecting the OLED display panel 30 with the housing.

As shown in FIG. 2, FIG. 2 is a structural schematic diagram of a flexible OLED display device according to the first preferred embodiment, shown with the flexible OLED display device in a folded state after being bent. The flexible OLED display device is bent to form a U-shaped structure. The U-shaped structure can not only secure the OLED display panel 30, but also supports the two ends of the OLED display panel 30 after the OLED display panel is bent so that the two ends of the OLED display panel 30 are prevented from rubbing and extruding each other. An arc-shaped corner is formed at each of the two ends of the first bending section. Because of the glue and the foam, a dead-fold phenomenon will not occur in the first bending section. The arc-shaped corners prevent the first bending section of the OLED display panel from being extruded and damaged. Because the OLED display panel is only fixedly connected with the first bending section on the substrate 10, other portions of the OLED display panel which are not connected with the bending sections can freely extend and further minimize the deformation and the extrusion pressure which are generated by bending.

Furthermore, each of two opposite ends of the substrate 10 is bent and defined an opposite receiving groove 14 and ends 31 of the flexible OLED panel are attached to the respective two receiving grooves 14.

Specifically, in the present embodiment, each of the two opposite ends of the substrate 10 is perpendicularly bent or approximately perpendicularly bent to form a first bending portion 101 and a second bending portion 102 in sequence. Each of the receiving groove 14 is constructed of the first bending portion 101, the second bending portion 102, and a portion of the substrate 10 which is adjacent to the first bending portion 101. Correspondingly, because the encapsulation layer 20 covers the surface of the substrate 10, two opposite ends of the encapsulation layer 20 are also double-bent to form those bending portions. The receiving grooves 14 are used for providing reserved spaces for the bent OLED display panel 30. The receiving grooves 14 accommodate the ends of the deformed OLED display panel 30 and perform functions of buffering and securing.

Figure 3:
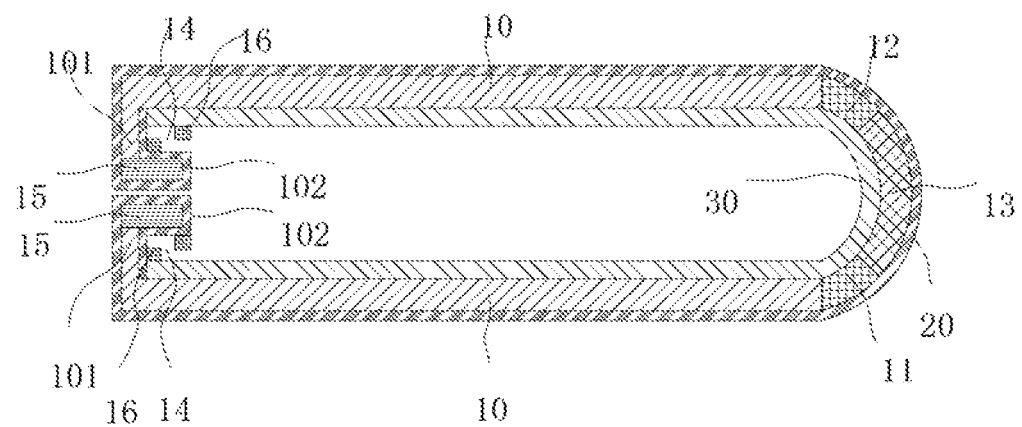
FIG. 3 is a structural schematic diagram of the second preferred embodiment of a flexible OLED display device according to the present disclosure.

Please refer to FIG. 3, which is a structural schematic diagram of the second preferred embodiment of a flexible OLED display device according to the present disclosure.

The flexible OLED display device according to the present preferred embodiment comprises a housing and an OLED display panel 30 disposed in the housing, wherein the housing comprises a substrate 10 and an encapsulation layer 20. The OLED display panel 30 is disposed on a surface of the substrate 10.

A first bending section is disposed in the middle of the substrate 10. The first bending section comprises a first buffer portion 11, a second buffer portion 12, and an adhesive layer 13. The encapsulation layer 20 covering the surface of the substrate 10 and a surface of the bending section The OLED display panel 30 comprises a second bending section, the first bending section is disposed at a position corresponding to the second bending section, and the first bending section is greater than the second bending section. The second bending section and the first bending section are bent together.

The substrate 10 is made of a metal material and performs a function of supporting the OLED display panel 30.

The encapsulation layer 20 is made of a leather material. Leather materials possess features of high flexibility and great abrasion resistance. The encapsulation layer 20 can not only be bent with the first bending section which is disposed on the substrate 10, but also protect the substrate 10 and the first bending section from being worn out, thereby reducing abrasion of the substrate 10 and the first bending section.

Both the first buffer portion 11 and the second buffer portion 12 are made of foam materials. The foam materials have tiny micropores and possess properties of great elasticity and light weight. The first buffer portion 11 and the second buffer portion 12 perform functions of resisting compression, buffering and supporting during bending.

The adhesive layer 13 is a cured glue layer. A space is reserved between the first buffer portion 11 and the second buffer portion 12 and the space is filled with glue. Then the OLED display panel 30 is attached to the surface of the substrate 10. After the glue is cured, an adhesive layer 13 is formed. The adhesive layer 13 performs a function of connecting the OLED display panel 30 with the housing.

As shown in FIG. 3, FIG. 3 is a structural schematic diagram of a flexible OLED display device according to the second preferred embodiment, shown with the flexible OLED display device in a folded state after being bent. The flexible OLED display device is bent to form a U-shaped structure. The U-shaped structure can not only secure the OLED display panel 30, but also supports the two ends of the bent OLED display panel 30 so that the two ends of the OLED display panel 30 are prevented from rubbing and extruding each other. An arc-shaped corner is formed at each of the two ends of the first bending section. Because of the glue and the foam, a dead-fold phenomenon will not occur in the first bending section. The arc-shaped corners prevent the OLED display panel from being extruded and damaged. Because the OLED display panel is only fixedly connected with the bending section on the substrate 10, other portions of the OLED display panel which are not connected with the bending sections can freely extend and further minimize the deformation and the extrusion pressure which are generated by bending.

Furthermore, each of two opposite ends of the substrate 10 is bent and defined an opposite receiving grooves 14 and ends 31 of the flexible OLED panel are attached to the respective two receiving grooves 14.

Specifically, in the present embodiment, each of the two opposite ends of the substrate 10 is perpendicularly bent or approximately perpendicularly bent to form a first bending portion 101 and a second bending portion 102 in sequence. Each of the receiving groove 14 is constructed of the first bending portion 101, the second bending portion 102, and a portion of the substrate 10 which is adjacent to the first bending portion 101. Correspondingly, because the encapsulation layer 20 covers the surface of the substrate 10, two opposite ends of the encapsulation layer 20 are also double-bent to form those bending portions. The receiving grooves 14 are used for providing reserved spaces for the bent OLED display panel 30. The receiving grooves 14 accommodate the ends of the deformed OLED display panel 30 and perform functions of buffering and securing.

Furthermore, each of the two ends of the substrate comprises a magnet and specifically, each magnet 15 is disposed on each outer surface of the second bending portion. After the flexible OLED display device is bent, the magnets 15 deposed at the two ends thereof are in a magnetic attraction with each other, so that two ends of the housing are closed more firmly.

Each of the two receiving grooves 14 comprises a foam 16 disposed therein and the foam is configured to prevent the ends 31 of the flexible OLED panel which are attached at the respective two receiving grooves from being extruded and deformed.

Figure 4:
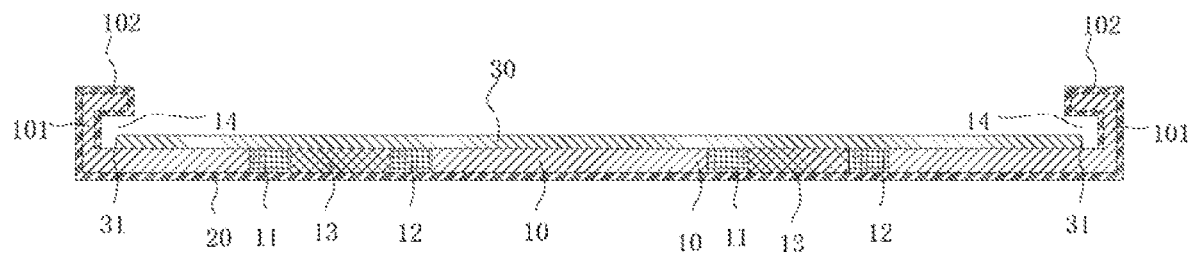
FIG. 4 is a structural schematic diagram of the third preferred embodiment of a flexible OLED display device according to the present disclosure.
Figure 5:
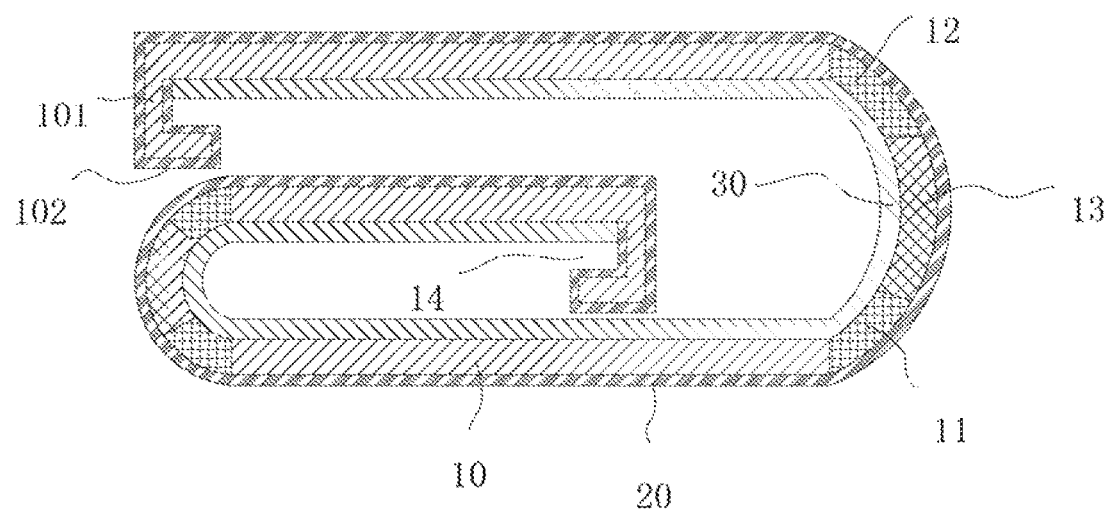
FIG. 5 is another structural schematic diagram of the third preferred embodiment of a flexible OLED display device according to the present disclosure.

Please refer to FIGS. 4-5, which are structural schematic diagrams of the third preferred embodiment of the flexible OLED display device according to the present invention.

As shown in FIG. 4, FIG. 4 is a structural schematic diagram of a flexible OLED display device according to the third preferred embodiment, shown with the flexible OLED display device in an open state. The flexible OLED display device according to the present preferred embodiment comprises a housing and an OLED display panel 30 disposed in the housing, wherein the housing comprises a substrate 10 and an encapsulation layer 20. The OLED display panel 30 is disposed on a surface of the substrate 10.

A first bending section is disposed in the middle of the substrate 10. The first bending section comprises a first buffer portion 11, a second buffer portion 12, and an adhesive layer 13. The encapsulation layer 20 covering the surface of the substrate 10 and a surface of the bending section.

The OLED display panel 30 comprises a second bending section, the first bending section is disposed at a position corresponding to the second bending section. The second bending section and the first bending section are bent together. A surface area of the first bending section is greater than a surface area of the second bending section.

The substrate 10 is made of a metal material and performs a function of supporting the OLED display panel 30.

The encapsulation layer 20 is made of a leather material. Leather materials possess features of high flexibility and great abrasion resistance. The encapsulation layer 20 can not only be bent with the first bending section which is disposed on the substrate 10, but also protect the substrate 10 and the first bending section from being worn out, thereby reducing abrasion of the substrate 10 and the first bending section.

Both the first buffer portion 11 and the second buffer portion 12 are made of foam materials. The foam materials have tiny micropores and possess properties of great elasticity and light weight. The first buffer portion 11 and the second buffer portion 12 perform functions of resisting compression, buffering and supporting during bending.

The adhesive layer 13 is a cured glue layer. A space is reserved between the first buffer portion 11 and the second buffer portion 12 and the space is filled with glue. Then the OLED display panel 30 is attached to the surface of the substrate 10. After the glue is cured, an adhesive layer 13 is formed. The adhesive layer 13 performs a function of connecting the OLED display panel 30 with the housing.

As shown in FIG. 5, FIG. 5 is a structural schematic diagram of a flexible OLED display device according to the first preferred embodiment, shown with the flexible OLED display device in a folded state after being bent. The flexible OLED display device is bent to form a U-shaped structure. The U-shaped structure can not only secure the OLED display panel 30, but also supports the two ends of the bent OLED display panel 30 so that the two ends of the OLED display panel 30 are prevented from rubbing and extruding each other. An arc-shaped corner is formed at each of the two ends of the first bending section. Because of the glue and the foam, a dead-fold phenomenon will not occur in the first bending section. The arc-shaped corners prevent the OLED display panel from being extruded and damaged. Because the OLED display panel is only fixedly connected with the first bending section on the substrate 10, other portions of the OLED display panel which are not connected with the bending sections can freely extend and further minimize the deformation and the extrusion pressure which are generated by bending.

Furthermore, each of two opposite ends of the substrate 10 is bent and defined an opposite receiving groove 14 and ends 31 of the flexible OLED panel are attached to the respective two receiving grooves 14.

Specifically, in the present embodiment, each of the two opposite ends of the substrate 10 is perpendicularly bent or approximately perpendicularly bent to form a first bending portion 101 and a second bending portion 102 in sequence. Each of the receiving groove 14 is constructed of the first bending portion 101, the second bending portion 102, and a portion of the substrate 10 which is adjacent to the first bending portion 101. Correspondingly, because the encapsulation layer 20 covers the surface of the substrate 10, two opposite ends of the encapsulation layer 20 are also double-bent to form those bending portions. The receiving grooves 14 are used for providing reserved spaces for the bent OLED display panel 30. The receiving grooves 14 accommodate the ends of the deformed OLED display panel 30 and perform functions of buffering and securing.

The beneficial effects are that the present disclosure provides a flexible OLED display device and disposes a housing which adapts to an OLED display panel before and after the OLED display panel is bent to support and protect the OLED display panel and to prevent the OLED display panel from being extruded, thereby preventing damage to the OLED display panel.

In summary, although the present invention has been described with preferred embodiments thereof, the above preferred embodiments are not used to limit the present invention. One of ordinarily skill in the art can carry out changes and modifications to the described embodiment without departing from the scope and the spirit of the invention that is intended to be limited only by the appended claims.

What is claimed is:
1. A flexible organic light emitting diode (OLED) display device, comprising: a housing and an OLED display panel disposed in the housing;
    wherein the housing comprises:
    a substrate having at least one first bending section disposed in the middle of the substrate; and
    an encapsulation layer covering a surface of the substrate and a surface of the first bending section;
    wherein the OLED display panel is disposed on the surface of the substrate, the OLED display panel comprises at least one second bending section, the first bending section is disposed at a position corresponding to the second bending section, and the first bending section is greater than the second bending section;
    wherein each of two opposite ends of the substrate is bent and defined an opposite receiving groove and ends of the flexible OLED panel are attached at the respective two receiving grooves;
    wherein each of the two ends of the substrate is double-bent and defined a first bending portion and a second bending portion in sequence and the receiving groove is constructed of the first bending portion, the second bending portion, and a portion of the substrate which is adjacent to the first bending portion.

2. The flexible OLED display device according to claim 1, wherein the encapsulation layer is made of a leather material.

3. The flexible OLED display device according to claim 1, wherein the first bending section comprises a first buffer portion, a second buffer portion, and an adhesive layer, and the adhesive layer is disposed between the first buffer portion and the second buffer portion.

4. The flexible OLED display device according to claim 3, wherein the housing and the OLED display panel is connected via the adhesive layer.

5. The flexible OLED display device according to claim 4, wherein the substrate is made of a metal material, the first buffer portion and the second buffer portion are made of a foam material, wherein a material of the adhesive layer is glue.

6. The flexible OLED display device according to claim 1, wherein each of the two ends of the substrate comprises a magnet, and each magnet is disposed on each outer surface of the second bending portion.

7. The flexible OLED display device according to claim 1, wherein each of the receiving grooves comprises a foam disposed therein and the foam is configured to prevent the ends of the flexible OLED panel from being extruded and deformed.

8. A flexible organic light emitting diode (OLED) display device, comprising: a housing and an OLED display panel disposed in the housing;
    wherein the housing comprises:
    a substrate having at least one first bending section disposed in the middle of the substrate; and
    wherein the OLED display panel is disposed on the surface of the substrate, the OLED display panel comprises at least one second bending section, the first bending section is disposed at a position corresponding to the second bending section, and the first bending section is greater than the second bending section;

wherein each of two opposite ends of the substrate is bent and defined an opposite receiving groove and ends of the flexible OLED panel are attached at the respective two receiving grooves;

wherein each of the two ends of the substrate is double-bent and defined a first bending portion and a second bending portion in sequence and the receiving groove is constructed of the first bending portion, the second bending portion, and a portion of the substrate which is adjacent to the first bending portion.

9. The flexible OLED display device according to claim 8, wherein the first bending section comprises a first buffer portion, a second buffer portion, and an adhesive layer, and the adhesive layer is disposed between the first buffer portion and the second buffer portion.

10. The flexible OLED display device according to claim 9, wherein the housing and the OLED display panel is connected via the adhesive layer.

11. The flexible OLED display device according to claim 10, wherein the substrate is made of a metal material, the first buffer portion and the second buffer portion are made of a foam material, wherein a material of the adhesive layer is glue.

12. The flexible OLED display device according to claim 8, wherein each of the two ends of the substrate comprises a magnet, and each magnet is disposed on each outer surface of the second bending portion.

13. The flexible OLED display device according to claim 8, wherein each of the receiving grooves comprises a foam disposed therein and the foam is configured to prevent the ends of the flexible OLED panel from being extruded and deformed.

* * * * *